United States Patent
Sugar et al.

(10) Patent No.: US 7,874,223 B2
(45) Date of Patent: Jan. 25, 2011

(54) ADJUSTABLE COMPLIANT MECHANISM

(76) Inventors: Thomas Sugar, 1537 E. Northshore Dr., Tempe, AZ (US) 85283; Dhiraj R. Nahar, 1137 E. Orange, Apt. 21, Tempe, AZ (US) 85281

( * ) Notice: Subject to any disclaimer, the term of this patent is extended or adjusted under 35 U.S.C. 154(b) by 1291 days.

(21) Appl. No.: 10/554,421

(22) PCT Filed: Apr. 26, 2004

(86) PCT No.: PCT/US2004/012923
§ 371 (c)(1),
(2), (4) Date: Oct. 24, 2005

(87) PCT Pub. No.: WO2004/096905
PCT Pub. Date: Nov. 11, 2004

(65) Prior Publication Data
US 2006/0213305 A1    Sep. 28, 2006

Related U.S. Application Data

(60) Provisional application No. 60/465,352, filed on Apr. 24, 2003.

(51) Int. Cl.
*F16H 21/00*    (2006.01)

(52) U.S. Cl. .................. 74/110; 74/469; 248/571
(58) Field of Classification Search .............. 74/110, 74/469, 471 XY, 490.09, 520; 83/527, 588; 248/571
See application file for complete search history.

(56) References Cited

U.S. PATENT DOCUMENTS

| | | |
|---|---|---|
| 5,099,708 A | 3/1992 | Chung |
| 5,678,468 A | 10/1997 | Lozano Bonet et al. |
| 5,890,524 A | 4/1999 | Tucker et al. |
| 6,502,671 B2 | 1/2003 | Hayford et al. |

*Primary Examiner*—William C Joyce
(74) *Attorney, Agent, or Firm*—Connolly Bove Lodge & Hutz LLP

(57) ABSTRACT

Constant force mechanisms and adjustable constant force mechanisms are described having two movable sliders constrained along two perpendicular axes and each abutting a resilient member. The mechanisms are adapted to produce an output force that is constant for a given input force. However, when an equilibrium position of one of the two resilient members is adjusted for a given mechanism, a different output force will result. Micro-compliant mechanisms are also described in which the resilient members may be made from one or more different elastomers.

12 Claims, 7 Drawing Sheets

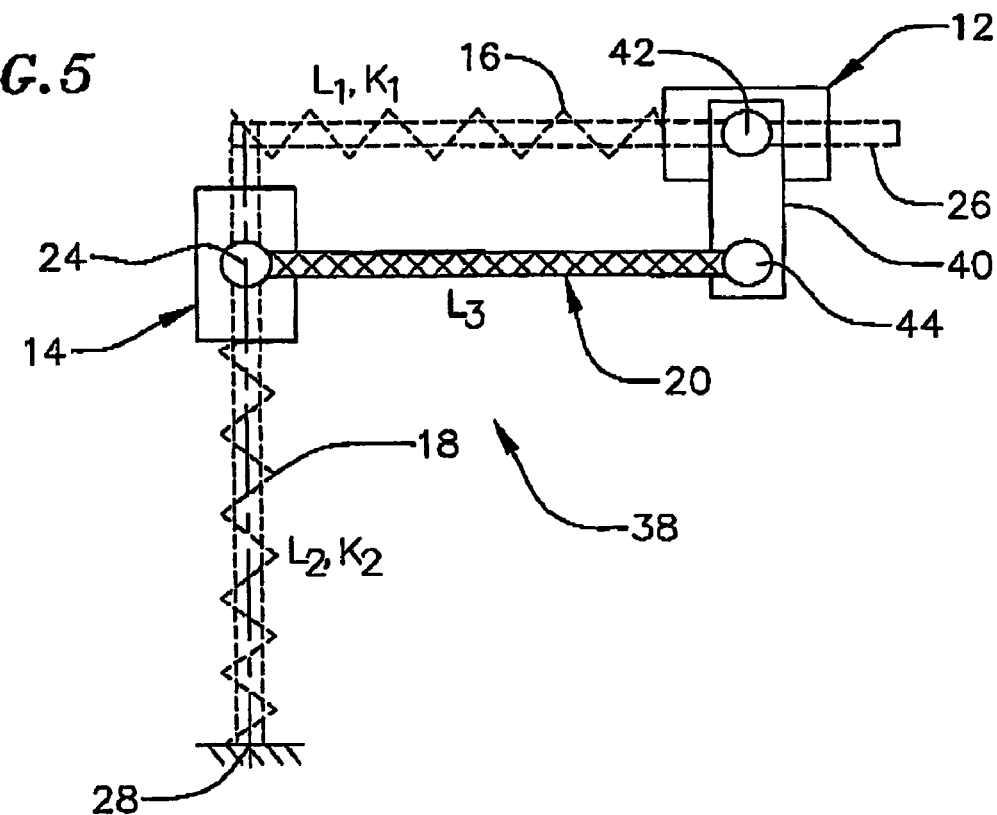
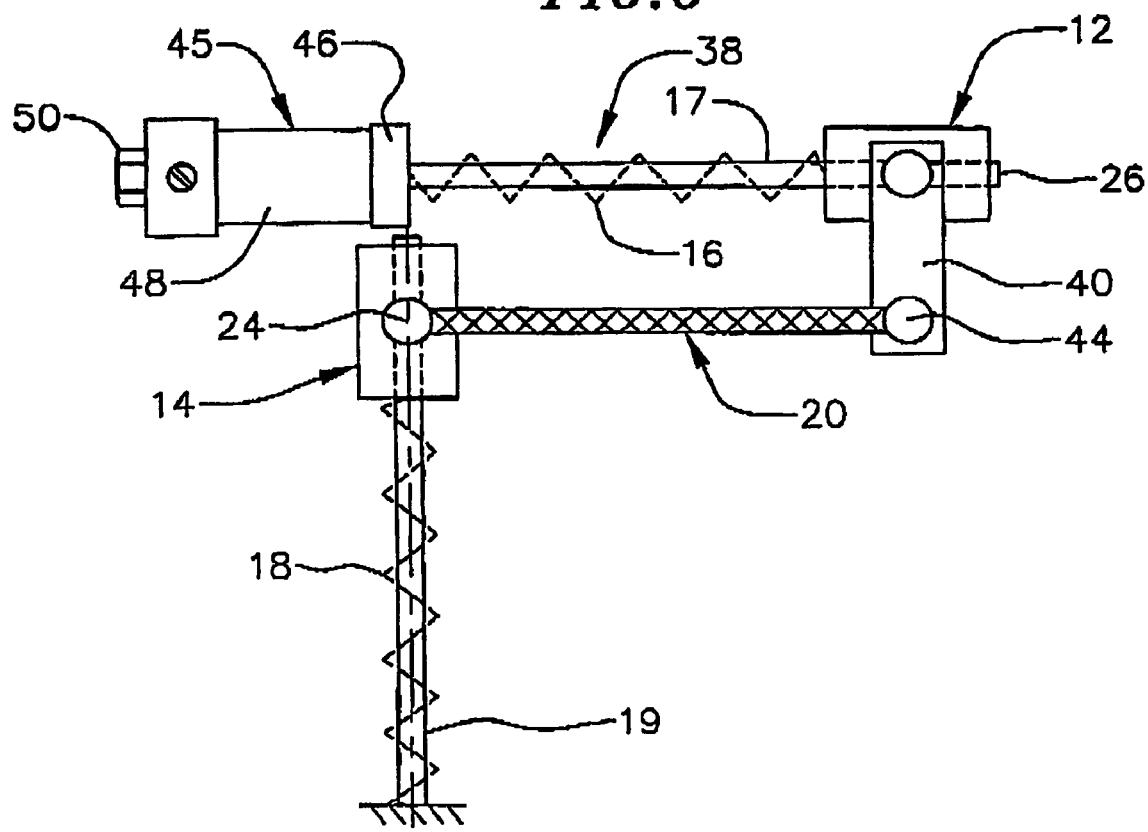

US 7,874,223 B2

ADJUSTABLE COMPLIANT MECHANISM

Compliant mechanisms and constant force mechanisms capable of producing a constant force for the entire range of motion are generally discussed herein with specific discussions extended to constant force mechanisms that are adjustable.

BACKGROUND

Mechanisms with interesting force-deflection characteristics have always intrigued engineers and scientists and thus have been a subject of on-going research. Mechanisms using linear springs to give increased force outputs with greater input displacements have been widely known and researched. In some applications, the output force may be desired to stay constant with a change in the input displacement. Such situations arise in applications such as robotic grasping, preventing damage to machine tools or end-effectors due to unforeseen position errors, biomedical applications, haptic devices, and micro-grasps. These mechanisms are referred to as "constant-force" mechanisms. An exemplary constant force-mechanism is described in U.S. Pat. No. 5,649,454 (Midha et al.), its contents are expressly incorporated herein by reference.

A constant-force mechanism is designed to produce a constant-force for the entire range of motion. This mechanism is a compliant mechanism as it gains movement from parts that flex, bend, or have a resiliency and in addition produces a desired constant-force output at all times. A constant force can be generated using hydraulic, pneumatic, and electrical device units, or even with a negator spring. But, from practical design considerations for micro applications, these solutions may not be possible. For micro applications, a solution applicable to a mechanical linkage system is needed which does not incorporate a power source.

Accordingly, it would be more useful to engineers and scientists alike if the constant-force output could be adjusted and that it has micro scale applications. Accordingly, there is a need for a variable or adjustable constant-force mechanism for increased versatility and one which has a number of different applications including micro-scale applications.

SUMMARY

The present invention may be implemented by providing a compliant mechanism comprising two support structures each comprising a translational axis mounted perpendicular to one another; a resilient member comprising a length attached to a slidable structure positioned on each support structure; a first link pivotally connected directly or indirectly to each of the slidable structures, and an adjustment block attached to one of the structures for changing the length of the resilient member of that structure.

Alternatively, the present invention may also be practiced by providing a compliant mechanism comprising an input structure, two resilient members each comprising a length connected directly or indirectly to the input structure and wherein the two resilient members are mounted parallel to one another along a lengthwise direction, a third resilient member comprising a length mounted directly or indirectly to the input structure with its length generally perpendicularly to the lengths of the two resilient members; and a plurality of links connected directly or indirectly to the input structure.

In another aspect of the present invention, there is provided a compliant mechanism for producing a constant force during a range of motion of the mechanism comprising a first structure comprising a first movable slider adapted to move along a first linear direction, a first resilient member comprising a length acting on the first slider so that the first slider experiences a pushing force from the first resilient member during movement of the first slider along at least a portion of the first linear direction, a second structure comprising a second movable slider adapted to move along a second linear direction, a second resilient member comprising a length acting on the second slider so that the second slider experiences a pushing force from the second resilient member during movement of the second slider along at least a portion of the second linear direction; a link comprising a length in pivotable relationship, either directly or indirectly, with both the first slider and the second slider; and an adjustment mechanism mechanically coupled to either the first resilient member or the second resilient member for adjusting the length of the first resilient member or the second resilient member.

In still yet another aspect of the present invention, there is provided a compliant mechanism comprising a slider connected to a first link by a first joint, the first link connected to a second link by a second joint, and the second link connected to a third link by a third joint, wherein the first link and second link are at a first angle to one another during a first position; the third joint is fixed to a first base; the slider is movable over a second base; and the first angle is adjustable to a second angle by moving either the first base or the second base.

BRIEF DESCRIPTION OF THE DRAWINGS

These and other features and advantages of the present invention will become appreciated as the same become better understood with reference to the specification, claims and appended drawings wherein:

FIG. 5 is a semi-schematic diagram of an alternative constant force mechanism provided in accordance with aspects of the present invention;

FIG. 6 is a semi-schematic diagram of an adjustable constant force mechanism comprising the constant force mechanism of FIG. 5 and an adjustable block;

DETAILED DESCRIPTION

The detailed description set forth below in connection with the appended drawings is intended as a description of the presently preferred embodiments of an adjustable constant force mechanism provided in accordance with practice of the present invention and is not intended to represent the only forms in which the present invention may be constructed or utilized. The description sets forth the features and the steps for constructing and using the adjustable constant force mechanism of the present invention in connection with the illustrated embodiments. It is to be understood, however, that the same or equivalent functions and structures may be accomplished by different embodiments that are also intended to be encompassed within the spirit and scope of the invention. Also, as denoted elsewhere herein, like element numbers are intended to indicate like or similar elements or features.

Figure 1:
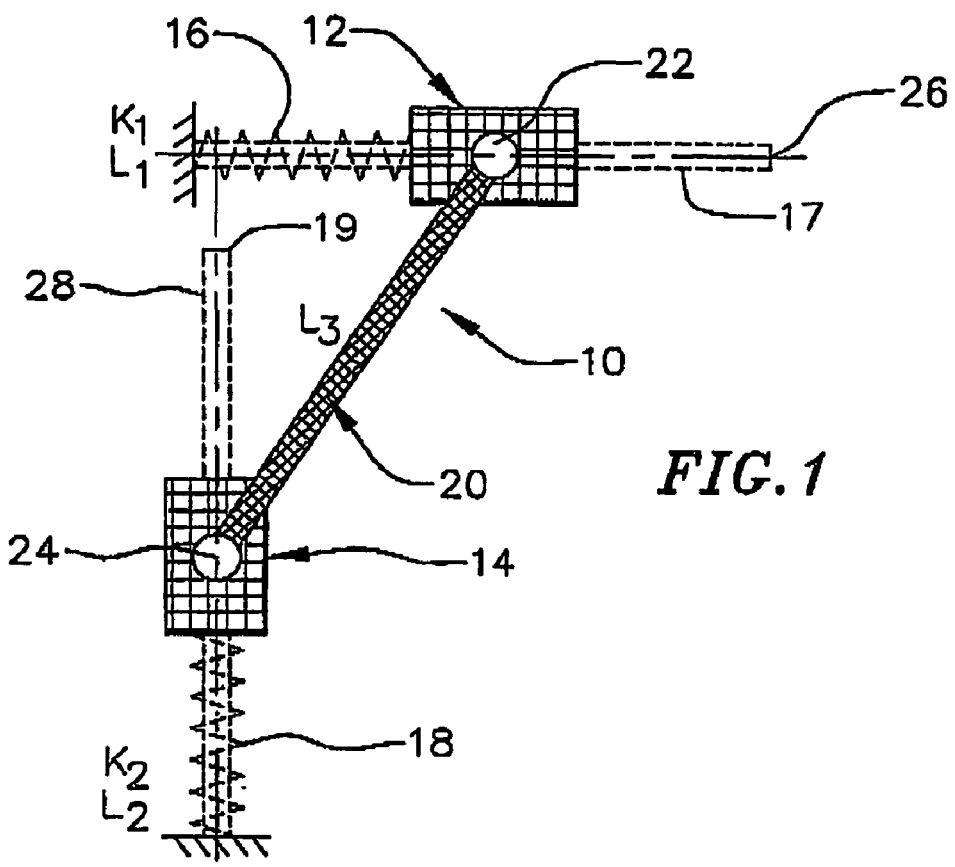
FIG. 1 is a semi-schematic diagram of a constant force mechanism provided in accordance with aspects of the present invention.

Referring now to FIG. 1, a constant-force mechanism provided in accordance with aspects of the present invention is shown, which is generally designated 10. In an exemplary embodiment, the constant force mechanism 10 (hereinafter "CFM") comprises two sliders, a first or horizontal slider 12 and a second or vertical slider 14, two springs 16, 18, and a rigid link or connecting rod 20. The directional orientation given to the sliders is for reference purposes only as the sliders may be rotated from horizontal or vertical.

In one exemplary embodiment, the first horizontal spring 16 has a normal or undeflected length $l_1$, the second vertical spring 18 has a normal length $l_2$, and the link 20 has a fixed length $l_3$. The sliders 12, 14 are positioned such that they are constrained and slide perpendicular to one another along the respective first and second axes 26, 28. The rigid link 20 is connected to the two sliders 12, 14 by way of two rotary joints 22, 24. The rotary joints are revolute-type joints as they can rotate or pivot without generating, at least significantly, a torsional moment. Exemplary revolute-type joints may include rivets, bolts, pins, and equivalent structures.

In a preferred embodiment, the sliders 12, 14 should slide freely to avoid or eliminate inertia and friction effects. As further discussed below, a working model may incorporate linear ball bearing slides 17, 19 (e.g., drawer slides) and slotted guide-ways to facilitate sliding the sliders along the two axes 26, 28. When the bearings are incorporated, the slides 12, 14 move with negligible friction and produce minimal inertia effects. The slides 12, 14 may be attached to the linear ball bearings slides 17, 19 through any number of mechanical connections. The slides may incorporate any number of configurations including a solid block, a block comprising curved surfaces, a cylinder, and may be made from metal, plastic, fiberglass, delrin, a polymer, or their equivalents.

Figure 2:
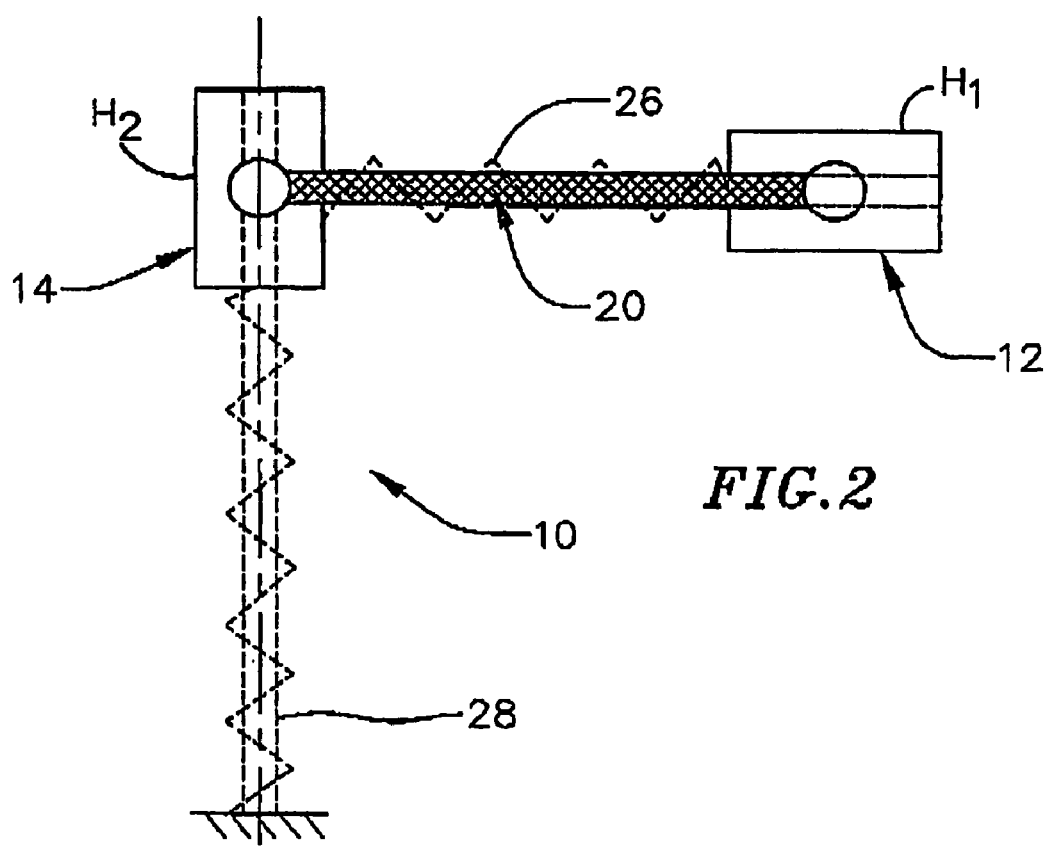
FIG. 2 is a semi-schematic diagram of the constant force mechanism of FIG. 1 with the sliders in their respective home positions.

Referring now to FIG. 2, an initial or starting configuration for the mechanism 10 is shown. In this and the following configurations, the constant force mechanism concept will be described. In the initial configuration, both springs 16, 18 are in an undeflected position, and both sliders are in their home positions H1, H2, which is the position along the two axes 26, 28 in which no force is imparted by the sliders on the springs to axially deflect the springs.

Figure 3:
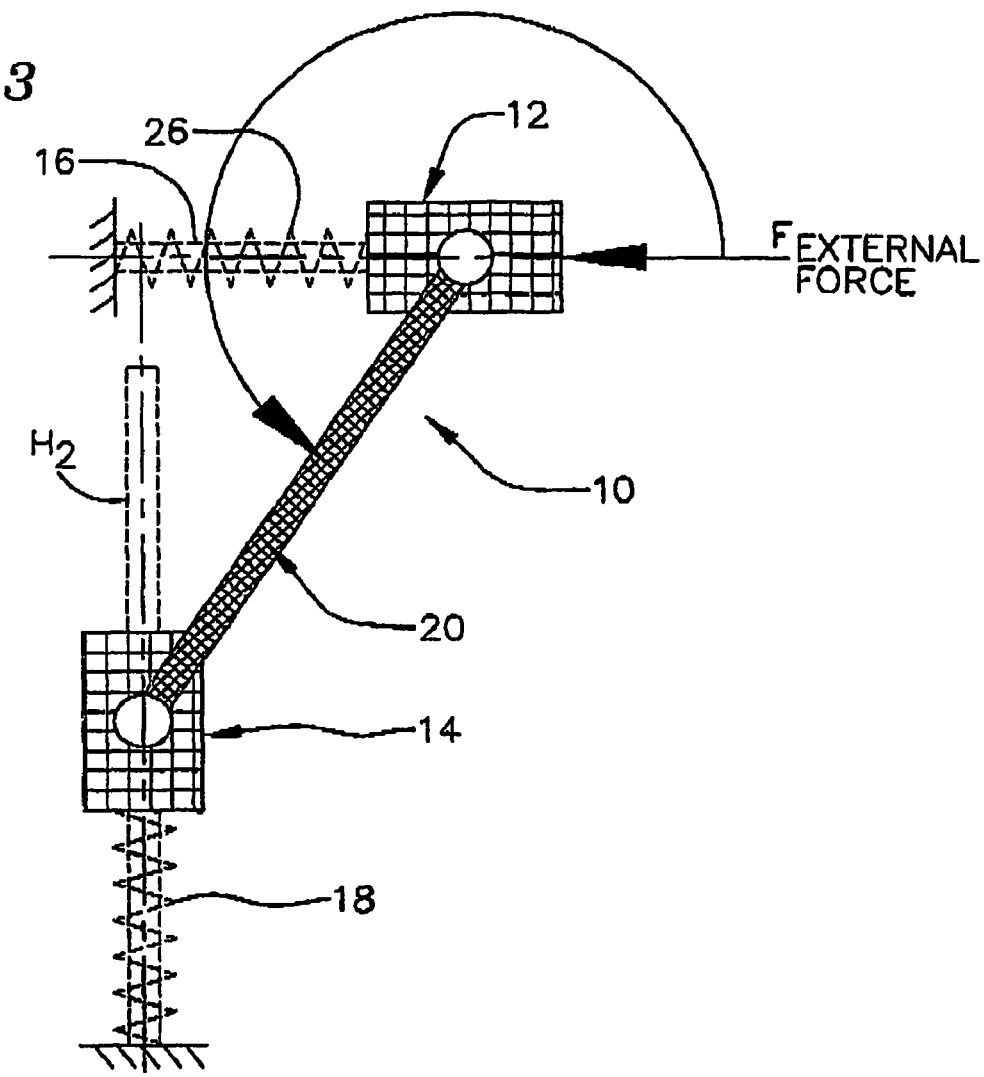
FIG. 3 is a semi-schematic diagram of the constant force mechanism of FIG. 1 having a force applied to the horizontal slider to produce an angular displacement for the link.

From the initial configuration, if a force F is applied to the first slider 12, it will move the slider 12 away from the home position H1 to compress the first spring 16 (FIG. 3). Concurrently therewith, the link 20 transfers a portion of the applied force F to the second slider 14 and moves the slider away from its home position H2 to compress the second spring 18. At some finite point in time, the rigid link 20, having length $l_3$, makes an angle $\Theta_3$ with the horizontal or first axis 26. In practice, the applied force can be a force generated by a user of, for example, a weight machine or an exercise machine.

The force can be applied directly to the first slider 12 or through a mechanical link, such as a bar, a strap, a handle, a belt, a chain, a cable, etc.

For a one-degree of freedom mechanism 10 shown in FIG. 3, the mechanism may be mathematically described as follows:

i) Generalized Coordinates: $\Theta_3$ ii) Virtual Displacements: $\delta\Theta_3$, $\delta x$, $\delta y$, where $\delta x$, and $\delta y$ are functions of $\delta\Theta_3$, written as $$\delta x = f(\delta\Theta_3), \delta y = f(\delta\Theta_3) \quad (1)$$

Figure 9:
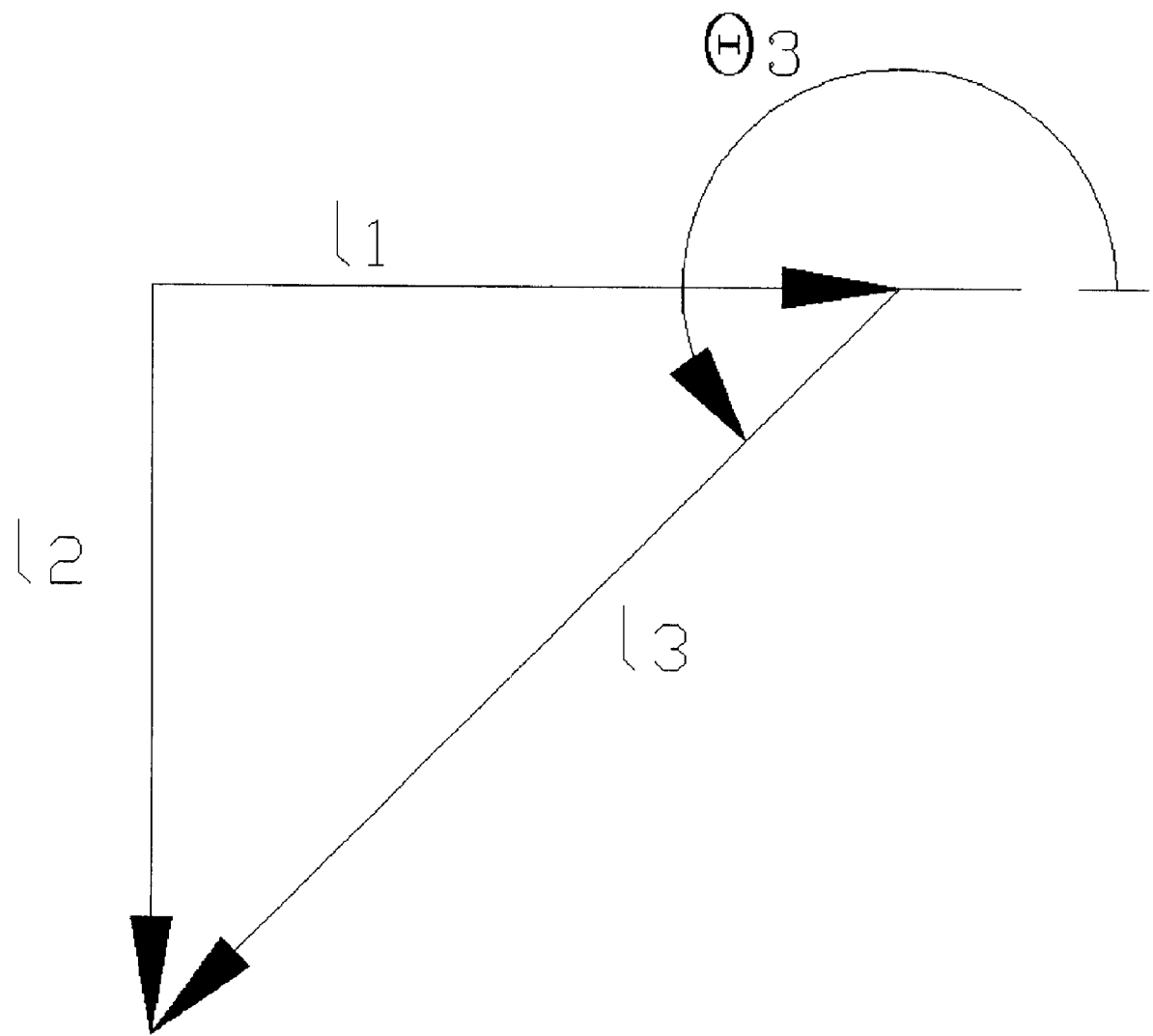
FIG. 9 is a vector analysis diagram of the constant force mechanism of FIG. 3.

In FIG. 9, the mechanism of FIG. 3 is shown in vector analysis form.

From the vector loop method for the mechanism shown in the vector diagram, the kinematics of the mechanism can be written:

$$\left.\begin{array}{l} l_1 + l_3\cos\Theta_3 = 0 \\ 0 + l_3\sin\Theta_3 = -l_2 \end{array}\right\} \quad (2)$$

$$\text{or, } l_1 = -l_3\cos\Theta_3, l_2 = -l_3\sin\Theta_3 \quad (3)$$

Differentiating the equations, it follows:

$$\dot{l}_1 = l_3\sin\Theta_3\dot{\Theta}_3, \dot{l}_2 = -l_3\cos\Theta_3\dot{\Theta}_3 \quad (4)$$

In terms of virtual displacements, the equations can be rewritten as:

$$\left.\begin{array}{l} \dot{x} = l_3\sin\Theta_3\dot{\Theta}_3 = \dot{l}_1 \\ \dot{y} = -l_3\cos\Theta_3\dot{\Theta}_3 = \dot{l}_2 \end{array}\right\} \quad (5)$$

$$\text{Therefore, } \frac{\dot{x}}{\dot{y}} = -\tan\Theta_3 \text{ or, } \dot{y} = \frac{-\dot{x}}{\tan\Theta_3} \quad (6)$$

Assuming the initial configuration is as given in FIG. 2, and then applying the Principle of Virtual Work, the total work done is given by:

$$\delta W = -F\delta x + [-k_1(l_1-l_3)]\delta x + [-k_2(l_2)]\delta y \quad (7)$$

In case of equilibrium, the change in work is zero. Thus, the equation may be written as follows:

$$-F\delta x + [-k_1(l_1-l_3)]\delta x + [-k_2(l_2)]\delta y = 0 \quad (8)$$

Substituting equations (3), (5), and (6), equation (8) can be rewritten as:

$$F\dot{l}_1 + k_1(-l_3\cos\Theta_3 - l_3)\dot{l}_1 + k_2(-l_3\sin\Theta_3)\left(\frac{-1}{\tan\Theta_3}\right)\dot{l}_1 = 0 \quad (9)$$

By expanding the terms, the equation becomes:

$$F\dot{l}_1 - k_1l_3\dot{l}_1\cos\Theta_3 - k_1l_3\dot{l}_1 + k_2l_3\dot{l}_1\sin\Theta_3\frac{\cos\Theta_3}{\sin\Theta_3} = 0 \quad (10)$$

or, $$F\dot{l}_1 - k_1l_3\dot{l}_1\cos\Theta_3 - k_1l_3\dot{l}_1 + k_2l_3\dot{l}_1\cos\Theta_3 = 0$$

If both the horizontal and vertical springs have the same material properties and the same stiffness, then, $$k_1 = k_2 \quad (11)$$

Substituting equation (11) in equation (10) and eliminating the common terms, the equation becomes:

$$F = k_1 l_3 \quad (12)$$

which is a constant-force and is dependent only on the stiffness of the horizontal spring 16 and the length of the rigid link $l_3$ connecting the two sliders 12, 14. Because both the stiffness and the length are constant, the force is therefore constant during the entire range of motion of the mechanism 10.

In a preferred embodiment, a constant force mechanism is provided in which the magnitude of the constant-force output may be actively changed to obtain a different constant-force output. This is termed as an adjustable constant-force mechanism (ACFM) having an adjustable constant-force output. In one exemplary embodiment, the adjustment may be made by actively changing the length of the horizontal spring 16, as shown in FIG. 4.

Figure 4:
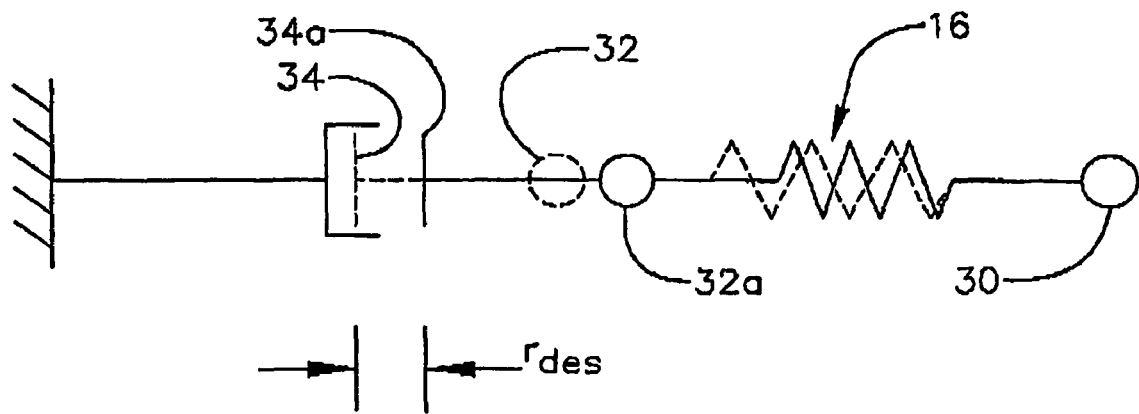
FIG. 4 is a semi-schematic diagram of an adjustment to the length of the horizontal spring.

In the schematic diagram of FIG. 4, the horizontal spring 16 is shown secured to a fixed or rigid first node 30, which in the FIG. 2 configuration would be the furthest point on the first axis 26 fixed by the rigid link 20. The spring 16 is secured to a second node 32 at its opposite end, which is attached to an adjustable block 34. The adjustable block 34 is adapted to move the second node 32 along a given axis via moving a link 36 that is attached to the node. Assuming then that the adjustable block 34 is adjusted to move a distance $r_{des}$ (where "des" is desired) to a second position 34a, the adjustment will cause a corresponding movement in the second node 32 to a second position 32a and will likewise shorten the spring 16 by the same distance. This movement, in effect changes, the equilibrium position of the spring 16, as further discussed below.

Referring again to equation (12), the movement of the spring by a distance ram will result in the following equation:

$$F_{des} = k_1 (l_3 + r_{des}) \quad (13)$$

Figure 10:
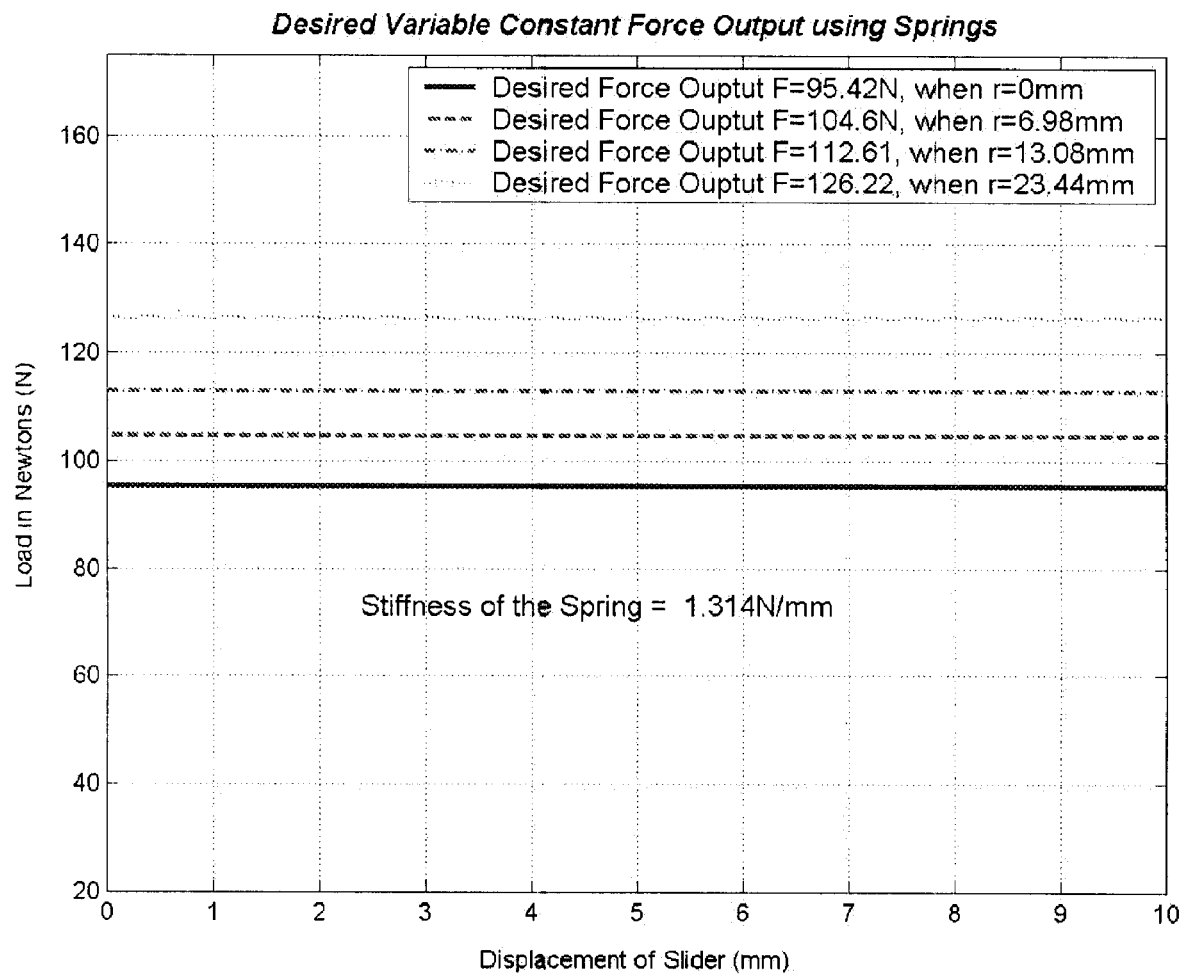
FIG. 10 is a graph showing the relationship between the output force of the constant force mechanism and the length of the spring.

Therefore, for a spring stiffness of $k_1 = 1.314$ N/mm, $l_3 = 72.62$ mm and $r_{des} = 0$ mm, the constant-force output is given as F=95.42N. Similarly, for, $r_{des} = 6.98$ mm, F=104.6N for, $r_{des} = 13.08$ mm, F=112.61N for, $r_{des} = 23.44$ mm, F=126.22N As is readily apparent by the three examples, the output force of the constant force mechanism is adjustable by varying the length of the spring. This relationship may be graphically plotted, as shown in FIG. 10.

Referring now to FIG. 5, an alternative constant force mechanism provided in accordance with aspects of the present invention is shown, which is generally designated 38. The alternative mechanism 38 is similar to the mechanism of FIGS. 1-3 in that it incorporates two sliders 12, 14, two springs 16, 18, and a link 20. However, a second rigid link 40 is added to provide added space for mounting the sliders. The second rigid link 40 is connected, at one end, to the first slider 12 via a rigid joint 42 and, at an opposite end, to the first rigid link 20 via a revolute joint 44 The rigid joint 42 is a type that locks or fixes the short second rigid link 40 with the first slider 12 so that the link and the slider do not significantly rotate or move relative to one another, and preferably do not rotate or move relative to one another. The two sliders 12, 14 are shown in their respective home positions in FIG. 5. In an alternative mechanism, the short second rigid link 40 may be added to the second slider 14 and to the rigid link 20 to provide added space. Still alternatively, two short rigid links 40 can be added to both sliders 12, 14 to provide added space. The alternative mechanism 38 operates in the same manner and is covered by the same principles discussed above with respect to the mechanism shown in FIGS. 1-3.

The alternative mechanism 38 may also operate as an adjustable constant force mechanism by varying the equilibrium position of the horizontal spring 16, such as by providing a preload to the spring by compressing or stretching the spring from its neutral position. Referring to FIG. 6, an adjustable constant-force mechanism 42 is shown comprising the constant force mechanism 38 of FIG. 5 connected to an adjustable block 45. In one exemplary embodiment, the adjustable block 45 comprises a movable head 46 movably connected to a base 48 via a rotatable device 50. When the rotatable device 50 is rotated, it moves the movable head 46 along the first axis 26 to change the equilibrium position of the spring 16. Hence, the horizontal spring 16, by moving the movable head 46, is capable of moving a distance $r_{des}$.

Although the adjustable block 45 is described with specificity as an adjustment means for adjusting the spring, a person of ordinary skill in the art will recognize that numerous other modifications may be made or incorporated to permit adjustment of the equilibrium position of the spring 16. Accordingly, changes to the adjustable block 45 are considered within the spirit and scope of the present invention. As examples, telescoping devices with retention means such as a pin and hole arrangement may be used, simple gear train, and a cam and lever system.

Verification of the output force of the adjustable constant force mechanism of FIG. 6 was conducted using a stiffness of 1.314N/mm for the first and second springs 16, 18 and a fixed length of 72.62 mm for the link 20. The extension link 40 has a free length of about 25 4 mm, which was arbitrarily selected and can vary depending on the desired mounting spacing for the slides 17, 19 and the sliders 12, 14. The stiffness of the two springs, which are the same, is found from the force-deflection curve obtained by testing the springs on a MTS Floor Testing Machine, which is a widely known device for force-deflection curve analysis.

Using the adjustable block 45 during the experiment, the length of the horizontal spring 16 is changed to change its equilibrium position to thereby adjust the constant-force output. Although the results shown below are from decreasing the length of the spring (i.e., an increase in $r_{des}$), the length of $r_{des}$ can be decreased (i.e., negative $r_{des}$ value), which will lengthen the spring, placing it in tension in order to decrease the desired output force. The results obtained from the experiment on the adjustable constant-force mechanism 42 of FIG. 6 are presented in FIG. 11.

The results are tabulated below:

| Change in length r in mm. | % Change in length | Desired Force Output in N. | Approximate Experimental Force Output in N. |
|---|---|---|---|
| r = 0 | 0 | 95.42 | 92 |
| r = 6.98 | 9.61 | 104.6 | 100 |
| r = 13.08 | 18.01 | 112.61 | 108 |
| r = 23.44 | 32.27 | 126.22 | 118 |

Figure 11:
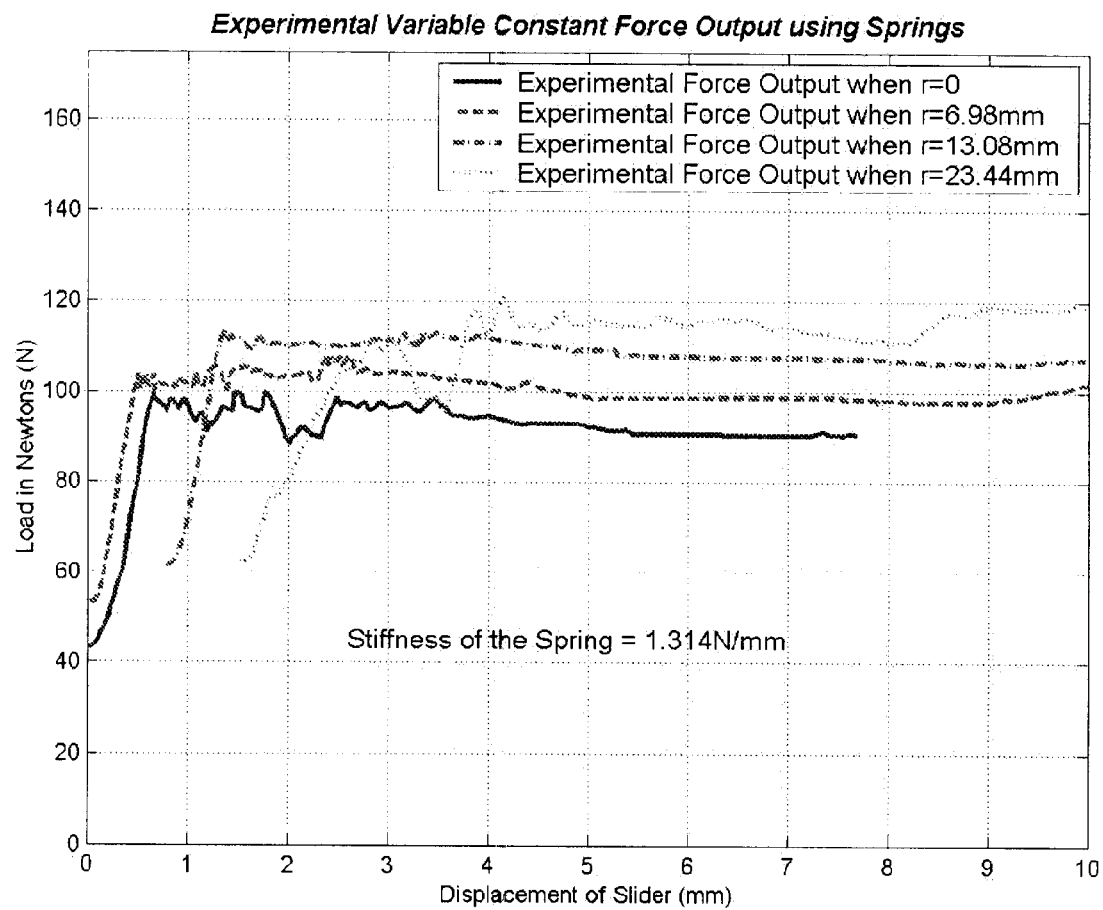
FIG. 11 is a graph showing results obtained from an experiment on the adjustable constant-force mechanism.

The difference in the actual force output of the mechanism 42 of FIG. 6 and the desired force output shown in FIG. 10 is due to the friction and inertia effects of the sliders 12. The high rise seen in the initial stage of FIG. 11 is perhaps due to the link 20 not immediately transmitting the input force from the horizontal slider 12 to the vertical slider 14, i.e. the load does not instantaneously jump from zero to the desired output force. However, this lag can be further avoided by preloading the springs to the constant-force output value, i.e. starting from a point where the link transmits the desired force accurately. For example, slider 12 can have a mechanical limit which does not allow it to fully reach the home position shown in FIG. 5. If the mechanical limit or stop prevents the slider 12 from moving the full length of link 20, then the angle of the link 20 will be greater than 180 degrees and both springs 16, 18 will be compressed storing energy. For example, in FIG. 11, the mechanical limit could be set to 72.62 mm-4 mm (length of link 20 less 4 mm) to insure that the force is a constant output.

The above-described mechanisms may be made from a number of shapes, sizes, and materials. However, movements of the sliders 12, 14 should be constrained to two perpendicular axes. Among the different options, two perpendicular rails or tracks along with means for minimizing friction, such as linear ball bearing slides (e.g., drawer slides), may be incorporated for moving the sliders 12, 14. The different rail slides may be mounted on different surfaces and on different planes depending on the particular mechanical connections used to constrain the sliders, to support the springs, to adjust the length of the horizontal spring 16 (or vertical spring 18 if the horizontal spring 16 is not adjusted), to make the desired slider configurations, etc. In addition, the adjustable block 45 may incorporate a number of different configurations including a simple motor system, a mechanical telescoping system, a hydraulic cylinder, etc. Accordingly, changes in the actual embodiment for producing an adjustable constant force mechanism comprising two springs mounted on two perpendicular axes are within the spirit and scope of the present invention.

Exemplary applications for the adjustable constant force mechanisms described elsewhere herein include adjustable constant force exercise equipment, medical devices for therapy and rehabilitation, and electrical connectors, just to name a few. For exercise equipment, pulleys, cables, chains, or belts, and various shaped bars may be used as means for providing an input force to the input slider for both positive and negative weight training. In addition, by incorporating an adjustment block (e.g., block 45 in FIG. 6), the spring can be adjusted to vary the force resistance. The adjustable constant force mechanism of the present invention may similarly be incorporated in exercise equipment to rehabilitate patients that have suffered from injuries or diseases and have loss some range of motion, strength, balance, or dexterity. In another example, constant force mechanisms are used to gravity balance and architectural lamp. Adjustable sliders can be used to adjust the output force if the lamp becomes heavier due to alternations. In a third example, constant force mechanisms are used to gravity balance arms such as robotic arms or even an exoskeleton to balance a human arm. An adjustable compliant mechanism can be used to make small alternations to the output force to balance the system. Typically, the exact weight and inertia is unknown so an adjustment method is needed to balance the arm.

Figure 8:
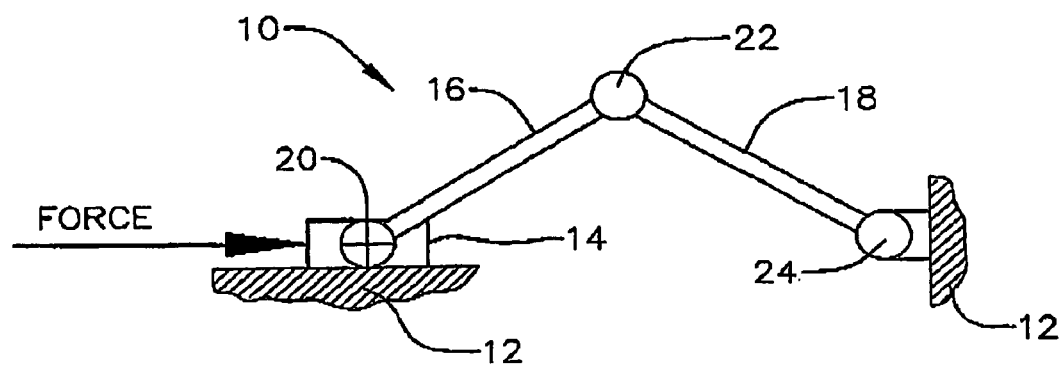
FIG. 8 is reproduced from FIG. 1a of U.S. Pat. No. 5,649,454 (Midha et al.)

In U.S. Pat. No. 5,649,454 to Midha et al., referred to and expressly incorporated herein by reference above, a host of constant force mechanisms are described with flexural pivots and compliant links. These mechanisms produce a fixed constant force output. These mechanisms can be adapted to produce adjustable outputs by adjusting the frame 12. In particular, in the compliant mechanisms of FIGS. 1a, 1d, 2a-2z, 3a, 3b, and 4, one or more of the bases 12 may be moved or adjusted in the direction of or against the direction of the input force (to compress or push or to pull or put in tension) to preload at least one of the flexural joint, compliant connecting rod, or compliant crank to thereby produce a different output force. FIG. 1a of the '454 patent is reproduced in drawings section as FIG. 8 for reference.

Constant-force mechanisms may be adapted to operate in a miniaturized or even a micro-level. Such a small scaled constant force mechanism has at least two main advantages. Firstly, this mechanism will be able to apply a constant-force even if there are small inevitable deflections, which are difficult to determine and control at a micro-level. A constant force mechanism is insensitive to micro-position errors. The second advantage at the micro-level is that the material structures are compliant and will naturally behave like the springs in the above-described analysis for the spring-based mechanisms. Using a miniature size constant force mechanism, a constant-force can be applied for different grasping and manipulation tasks.

Figure 7:
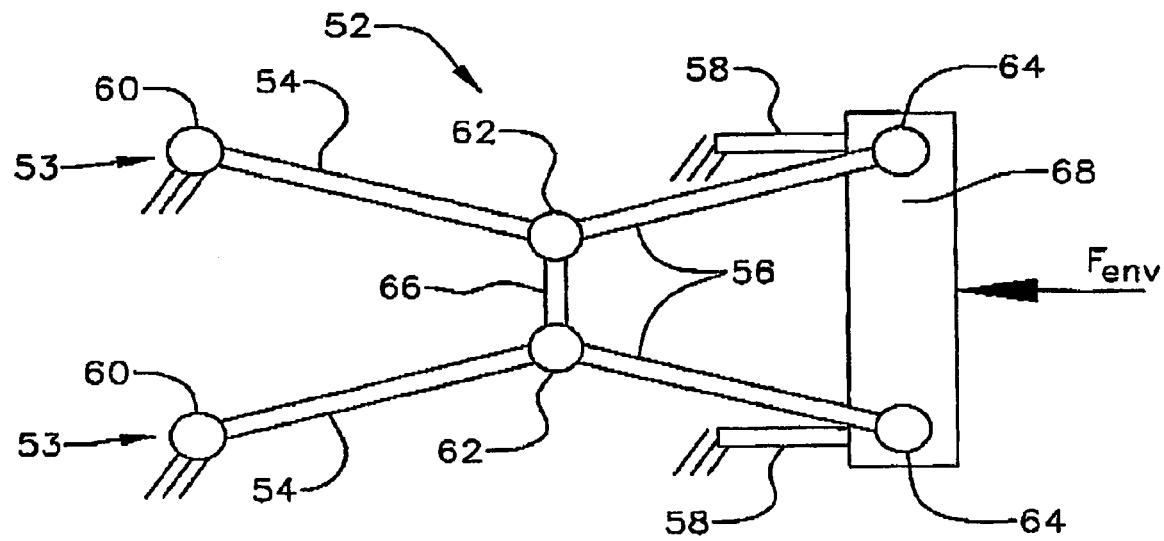
FIG. 7 is a semi-schematic diagram of a micro-compliant mechanism provided in accordance with aspects of the present invention.

Referring now to FIG. 7, a micro constant-force mechanism 52 provided in accordance with aspects of the present invention is shown. The mechanism 52 comprises a pair of slider crank mechanisms 53 working in tandem. Each crank mechanism comprises a pair of links 54, 56, a material link 58, and three revolute joints 60, 62, 64. The two mechanisms 53 are joined together by a center material link 66 and an output link 68. The two links 54, 56 are positioned at an angle relative to one another, excluding 0 degree and 180 degrees.

In one exemplary embodiment, the pair of cranks 54, 56 and the output link 68 are rigid whereas the three material links 58, 58, 66 are compressible or deformable. The four cranks 54, 56 are preferably of equal lengths. In an exemplary embodiment, materials like plastics may be used for the three material links 58, 58, 66, which will serve as springs in the constant-force mechanism 52 of FIG. 7. Elastomers have been developed and have been used successfully as highly compliant material springs. Exemplary elastomers capable of performing as compliant material springs include polycarbonate and arcylonitrile. The material springs could either be linear springs or flexural members. The flexural members are good for small force outputs as they are highly compliant and thus can resist only smaller magnitude forces.

The constant force mechanism 52 of FIG. 7 may be made by assembling components made from conventional molding techniques. However, for MEMS application, such constant force mechanism may be made from silicon micro-fabrication processes.

In the FIG. 7 mechanism 52, if a force is applied to the output link 68, the two horizontal links 58, 58 will flex. The compliant material in the center material link 66 will also act like a spring but will only compress in the vertical direction as the output link 68 is moved to the left. The force relationship at the output may be described by the following equation:

$$F_{env} = 2*K*l$$

Thus, much like the constant force mechanisms described with reference to FIGS. 1-3 and 5, a mechanism made from an elastomeric material for small scale applications may also be incorporated to produce a constant force output. These mechanisms can have an adjustable constant-force output if the springs 58, 58 have an additional pre-load force caused by adjusting the equilibrium position.

Although the preferred embodiments of the invention have been described with some specificity, the description and drawings set forth herein are not intended to be delimiting, and persons of ordinary skill the art will understand that various modifications may be made to the embodiments discussed herein without departing from the scope of the invention, and all such changes and modifications are intended to be encompassed within the appended claims. Various changes to the adjustable constant-force mechanisms may be made such as modifying the materials, the size, the mechanical connections, the adjustment mechanisms for adjusting the lengths of the springs, etc. to produce the force relationship: $F=k(1+r)$ and $F=2*K*l$. Other changes include using a resilient member instead of spiral wound metallic springs. For example, instead of an adjustment mechanism, a motor, cam, lever, pulley, or a locking mechanism comprising a pin and receptacle combination may be used to adjust the $r_{des}$ length of the spring, which may in turn require the use of conventional mechanical devices such as gears, cables, belts, fasteners, and the like. Accordingly, many alterations and modifications may be made by those having ordinary skill in the art without deviating from the spirit and scope of the invention.

What is claimed is:

1. A compliant mechanism comprising
   first and second support structures each comprising a translational axis mounted perpendicular to one another;
   first and second resilient members, each comprising a length attached to first and second slidable structures, respectively, positioned on each support structure;
   a first link pivotally connected directly or indirectly to each of the slidable structures, and
   an adjustment block attached to one of the structures for changing the length of the resilient member of that structure, wherein the resilient members have an equal stiffness such that, in response to an applied force against the first slidable structure, the compliant mechanism provides a substantially constant acting force against the applied force as the slidable structures translate along a full length of each respective support structure.

2. The compliant mechanism of claim 1, further comprising a second link connected to the first link and to one of the slidable structures.

3. The compliant mechanism of claim 1, wherein the adjustment block comprises a threaded rod.

4. The compliant mechanism of claim 1, wherein the adjustment block comprises a movable head mechanically linked to one of the resilient members for compressing or stretching the length of the resilient member.

5. The compliant mechanism of claim 4, wherein one of the movable slider is connected to a mechanical connector for pushing on or pulling on by a user.

6. The compliant mechanism of claim 1, wherein each support structure comprises a linear ball bearing slide.

7. A compliant mechanism for producing a constant force during a range of motion of the mechanism comprising:
   a first structure comprising a first movable slider adapted to move along a first linear direction, a first resilient member comprising a length acting on the first slider so that the first slider experiences a pushing force from the first resilient member during movement of the first slider along at least a portion of the first linear direction,
   a second structure comprising a second movable slider adapted to move along a second linear direction, a second resilient member comprising a length acting on the second slider so that the second slider experiences a pushing force from the second resilient member during movement of the second slider along at least a portion of the second linear direction;
   a link comprising a length in pivotable relationship, either directly or indirectly, with both the first slider and the second slider; and
   an adjustment mechanism mechanically coupled to either the first resilient member or the second resilient member for adjusting the length of the first resilient member or the second resilient member, wherein the resilient members have an equal stiffness such that, in response to an applied force against the first slidable structure, the compliant mechanism provides a substantially constant acting force against the applied force as the structures translate along a full length of each respective translational axis.

8. The compliant mechanism of claim 7, wherein the first linear direction and second linear direction are perpendicular to one another.

9. The compliant mechanism of claim 7, wherein the adjustment mechanism comprises at least one of a threaded rod or an adjustment pin.

10. The compliant mechanism of claim 7, further comprising a second rigid link comprising a length.

11. The compliant mechanism of claim 10, wherein the second rigid link is connected to the first slider by a rigid joint, the link is connected to the second rigid link by a revolute joint, and the link is connected to the second slider by a revolute joint.

12. The compliant mechanism of claim 10, further comprising a third rigid link comprising a length.

* * * * *